US008566771B1

(12) United States Patent
Arp et al.

(10) Patent No.: US 8,566,771 B1
(45) Date of Patent: Oct. 22, 2013

(54) AUTOMATION OF INTERCONNECT AND ROUTING CUSTOMIZATION

(71) Applicant: International Business Machines Corporation, Armonk, NY (US)

(72) Inventors: Andreas Arp, Nufringen (DE); Florian Braun, Echterdingen (DE); Guenther Hutzl, Sindelfingen (DE); Michael V. Koch, Ehningen (DE); Matthias Ringe, Tuebingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/623,230

(22) Filed: Sep. 20, 2012

(51) Int. Cl.
*G06F 17/50* (2006.01)

(52) U.S. Cl.
USPC ............ 716/130; 716/119; 716/126; 716/129

(58) Field of Classification Search
USPC .................................. 716/130, 119, 126, 129
See application file for complete search history.

(56) References Cited

U.S. PATENT DOCUMENTS

| 5,856,927 | A | * | 1/1999 | Greidinger et al. | ........... 716/122 |
| 6,499,131 | B1 | * | 12/2002 | Savithri et al. | ................ 716/115 |
| 6,510,545 | B1 | * | 1/2003 | Yee et al. | ...................... 716/126 |
| 7,376,921 | B2 | * | 5/2008 | Fotakis et al. | ................. 716/129 |
| 7,743,354 | B2 | | 6/2010 | Albrecht et al. | |
| 7,802,215 | B2 | | 9/2010 | Reddy et al. | |
| 7,989,849 | B2 | * | 8/2011 | Sherlekar et al. | ............. 257/207 |
| 8,122,412 | B2 | | 2/2012 | McElvain et al. | |
| 2004/0078767 | A1 | * | 4/2004 | Burks et al. | ........................ 716/8 |
| 2006/0027919 | A1 | * | 2/2006 | Ali et al. | ........................ 257/734 |
| 2008/0246510 | A1 | * | 10/2008 | Kundu et al. | .................... 326/41 |
| 2011/0252389 | A1 | | 10/2011 | Albrecht et al. | |
| 2012/0241986 | A1 | * | 9/2012 | Sherlekar et al. | ............. 257/784 |

FOREIGN PATENT DOCUMENTS

JP 2011210053 A 10/2011

OTHER PUBLICATIONS

Tian, et al.; "Grid-to-Ports Clock Routing for High Performance Microprocessor Designs"; ISPD '11—Proceedings of the 2011 International Symposium on Physical Design; Mar. 27-30, 2011; Santa Barbara, California; Copyright 2011; ACM 978-1-4503-0550-1/11/03.

* cited by examiner

*Primary Examiner* — Stacy Whitmore
*Assistant Examiner* — Magid Dimyan
(74) *Attorney, Agent, or Firm* — Isaac J. Gooshaw (57) ABSTRACT

A computer identifies a metal layer, in a design, which contains routing track segregated by blockages. The sections of segregated routing track are removed and new routing track are added along the periphery of the blockage. It is determined if contact can be created between the component and the new routing track with the addition of a vertical interconnect access (VIA) structure. If contact can be created, then the VIA structures are added to create contact. If no contact can be created then another new routing track is added with (VIA) structures such that contact is created. Further routing track and VIA structures are added to higher metal layers to form a connection between a routing terminus located on a top metal layer and the new routing track and component.

20 Claims, 10 Drawing Sheets

AUTOMATION OF INTERCONNECT AND ROUTING CUSTOMIZATION

FIELD OF THE INVENTION

The present invention relates generally to microprocessor design, and more particularly to the automation of late stage engineering changes in routing.

BACKGROUND

The proliferation of integrated circuits continues to place increasing demands on the turnaround time for customized circuit design. An ever-increasing number of microprocessors are being added to many devices, components and architectures, which never utilized microprocessors. The increase in overall microprocessor demand has lead to an increased demand for specialization of microprocessors to handle new additional tasks or to effectuate sophisticated operations for a given environment.

Often the general process of a given chip is known while the finer details of the functionality of the chip are not known until late in the engineering process. Customers who buy bulk batches of microprocessors base some of the decision regarding chip design, on consumer feedback and polls. This had lead to a system where a customer may desire attributes in a microprocessor that were not fully elucidated when the design process began. To aid in the speed in which a given microprocessor may be customized and produced, engineers often utilize automated computer aided design techniques.

Mesh or grid architectures are popular approaches to the distribution of critical global signals on a chip. They may include clock signals, power and ground stripes. Late stage engineering changes often include changes in the routing structures and system design of a microprocessor. This may be an expensive, labor and time consuming process.

SUMMARY

Embodiments of the present invention provide a system, method, and program product for automated interconnect and routing customization. A computer identifies a segment routing track located in a first section of a second metal layer that includes an alpha routing track, wherein the segment routing track is segregated from the alpha routing track by a first blockage, and wherein the second metal layer is adjacent to a first metal layer that includes a first component that terminates within the first metal layer. The computer removes the segment routing track from the first section of the second metal layer. The computer adds a first routing track to the second metal layer along at least a portion of a periphery of the first section, such that the first routing track is not in contact with the alpha routing track and such that at least a portion of the first routing track is substantially parallel to at least a portion of the alpha routing track. The computer identifies a first component located outside a region of contact of the first routing track and adds a second routing track to the second metal layer such that the first component is within the region of contact of the second routing track. The computer adds a connection between the second metal layer and a routing terminus.

DETAILED DESCRIPTION

Embodiments of the present invention will now be described in detail with reference to the accompanying drawings.

The foregoing description of various embodiments of the present invention have been presented for purposes of illustration and description. It is not intended to be exhaustive nor to limit the invention to the precise form disclosed. Many modifications and variations are possible. Such modifications and variations that may be apparent to a person skilled in the art of the invention are intended to be included within the scope of the invention as defined by the accompanying claims. It is to be understood by those skilled in the art that the automated interconnect and routing customization described and illustrated herein is not to be limited to the routing of a clock signal and may be applied to the routing of any known signal and/or energy pathway known in the art.

The numbers assigned to the various metal layers referred to in this document are not intended to be limiting in any manner. The locations of the metal layers are not labeled or indicated in the Figures but may be herein referenced as being in association to or including certain components. The numbers are used only for the purpose of orientation and location tracking of various parts, components, and structures as microprocessor and integrated circuit designs are modified. In practice, it may be common for each of the designated metal layers discussed herein to be composed of a number of separate metal layers. The use of the term track is not to be interpreted as a limitation as all tracks used herein may include both real wires, blockages for wires or a signal conducting structure that is a usable resources for the routing of a clock signal.

Figure 1:
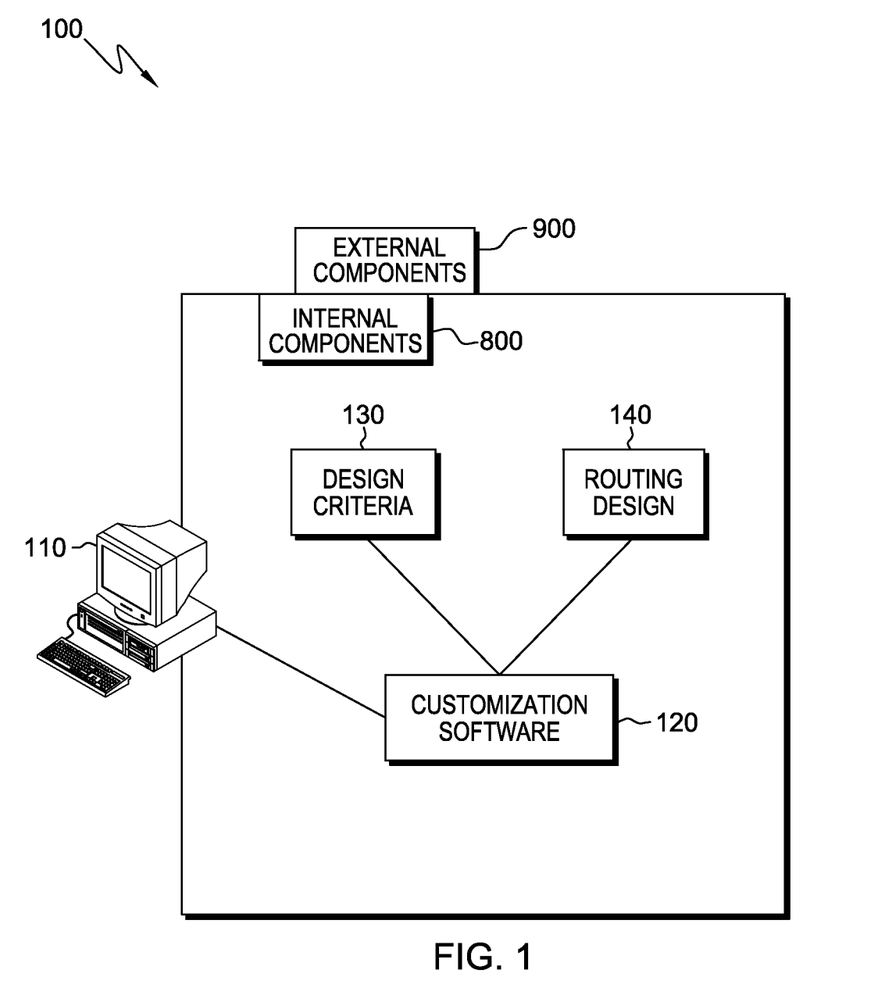
FIG. 1 is a block diagram of an automated customization system in accordance with an embodiment of the present invention.

FIG. 1 is a block diagram illustrating automated customization system 100 in accordance with one embodiment of the present invention. Automated customization system 100 includes computer 110 that includes customization software 120. Customization software 120 has access to design criteria 130 and routing design 140.

In this exemplary embodiment, customization software 120, design criteria 130 and routing design 140 are stored on computer 110. However, in other embodiments, customization software 120, design criteria 130 and routing design 140 may be stored externally and accessed through a communication network (not shown). The communication network can be, for example, a local area network (LAN), a wide area network (WAN) such as the Internet, or a combination of the two, and may include wired, wireless, fiber optic or any other connection known in the art. In general, the communication network can be any combination of connections and protocols that will support communications between computer 110 and customization software 120, design criteria 130 and routing design 140 in accordance with a desired embodiment of the present invention.

In various embodiments of the present invention, computer 110 can be a server, a laptop computer, a tablet computer, a netbook computer, a personal computer (PC), or a desktop computer. In another embodiment, computer 110 represents a computing system utilizing clustered computers and components to act as a single pool of seamless resources. In general, computer 110 can be any computing device or a combination of devices with access to customization software 120, design criteria 130 and routing design 140 and is capable of running customization software 120. Computer 110 may include internal components 800 and external components 900, as depicted and described in further detail with respect to FIG. 10.

Customization software 120 facilitates the design of new circuit boards and microprocessors by automating, at least in part, the process of design customization relating to routing track design. In an exemplary embodiment, customization software 120 operates under the assumption that there exists an area of routing track which has been blocked-off or isolated from use as general routing track. This isolated area of routing track is reserved for late stage design customization relating to routing track design. In other embodiments, the isolated area of routing track may not be a requirement for the use and operation of customization software 120. For example, customization software 120 may be used to automatically route around an obstruction and/or blockage of a routing track of a specific metal layer. In an example, a macrocell structure, which is added to an existing microprocessor design, may protrude up into a metal layer that includes a routing track. The existence of the macrocell structure in close proximity to, or in contact with, the routing track may result in short circuits. Therefore, the routing track must be routed around the macrocell structure which protrudes into the metal layer, while attempting to minimize the impact on track length and timing skew.

In this exemplary embodiment, design criteria 130 is a production rule file that contains all the design limitations and rules present for a given design of a microprocessor and integrated circuit board. Due to the limitations of production methods and the physical attributes of various materials there are inherent limitations that must be applied to a given microprocessor and integrated circuit board design. Design limitations and rules are often spatial limitations that restrict where various components may be located on a microprocessor chip and integrated circuit board. There are also limitations on track length and track location within the metal layers of a microprocessor chip. For example, the limits on track length, for a specific metal layer, dictate that a routing track is placed a number of nanometers away from the next nearest routing track. Design criteria 130 may vary in content in other embodiments.

In this exemplary embodiment, routing design 140 is a design file which contains a design for a microprocessor. Routing design 140 includes a microprocessor's components, the location of various structures, a design of the routing track, and the contents of the metal layers.

In this exemplary embodiment, the design for a microprocessor is in routing design 140 and the rules and limitations contained in design criteria 130 are applied as the routing pathways are added to the microprocessor's design. As depicted in FIGS. 2-8, the two top-most metal layers of the microprocessor's design, designated herein as the fifth and sixth metal layers, combine respective vertical and horizontal track thereof to form a clock mesh (a routing terminus). A routing terminus is a terminal component in a routing pathway which is often the source or destination of a signal. A routing terminus can be a clock signal source (i.e., a clock mesh), a power source, an electromagnetic signal source, a ground terminal, or a component in the design or combinations thereof. There are two metal layers, herein designated as the second and fourth metal layers, which are located beneath the clock mesh and include routing track with sections of blocked-off routing track. The non-blocked routing tracks of the second and fourth metal layers are designated as alpha and beta routing tracks, respectively. The blocked-off track of the second metal layer is designated as a segment routing track. The area located on the second metal layer, which contains the segment routing track is herein referred to as a first section. The blocked-off routing track of the fourth metal layer are designated as fourth routing track. A portion of the routing tracks, both blocked and unblocked, of the second metal layer run in a substantially perpendicular direction to the routing track of the fourth metal layer. Substantially, perpendicular or parallel is to be understood by a person with ordinary skill in the art as encompassing small variations in orientation such that the perpendicular or parallel nature of one object relative to another is understood. The segment routing track and fourth routing track are located such that, if viewed from the top down, i.e., fourth metal layer to the second metal layer, the segment routing track and fourth routing track appear to overlap, forming a mesh, which may be referred to as a virtual mesh. At least one fourth routing track, in the fourth metal layer, is connected to the clock mesh using a VIA structure. (A VIA may be defined as an acronym for Vertical Interconnect Access.) In this embodiment, a VIA structure forms a connection capable of carrying a signal between two or more metal layers.

In this exemplary embodiment, the third metal layer is located beneath the fourth metal layer and above the second metal layer. The third metal layer contains a space or a portion of the third metal layer, located above the first section, where a routing track and VIA structures may be placed and is herein designated as a second section. The second section, when seen from a top down view, overlaps a portion of the adjacent first section, which is located in the second metal layer. Thus, at least a portion of the top most face of the first section is adjacent to the bottom most face of the second section.

The first metal layer, of this exemplary embodiment, is designed for general routing purposes but contains routing tracks that are connected to clock pins. The first metal layer and any metal layers beneath the first metal layer are utilized for the construction of various components and structures which include the functional units of a microprocessor, for example, transistors. The first metal layer's routing tracks that are connected to clock pins are herein designated as a components. The components terminate at or before the point where the first metal layer interfaces with the second metal layer. The structure and content of the metal layers of the microprocessor design, the composition of a component, and the content of routing design 140 and design criteria 130 may vary in other embodiments.

FIGS. 2-8 are illustrations representing one exemplary implementation of a system for the automation of routing customization. Due to the number of parts involved in the illustrations, some parts which are initially shown are later shown as removed from select figures to simplify the illustrations. Parts which are not shown, but still exist, will be noted as such.

In the example illustrated in FIGS. 2-8, the third metal layer includes two metal layers which are then used to form the needed connections for contact between the second and fourth metal layers. A connection capable of contact is created when a pathway is created, between two structures, that is capable of carrying, transferring or transmitting from one structure to the other structure, a clock signal source, electrical energy, magnetic energy, or electromagnetic energy. Although not shown in FIGS. 2-8, the third metal layer is not empty real estate but contains both gamma routing tracks and a number of various routing track, which must be taken into consideration when placing new routing track into the third metal layer. Gamma routing tracks within the third metal layer are routing track structures that are not used for automated interconnect and routing customization.

Figure 2:
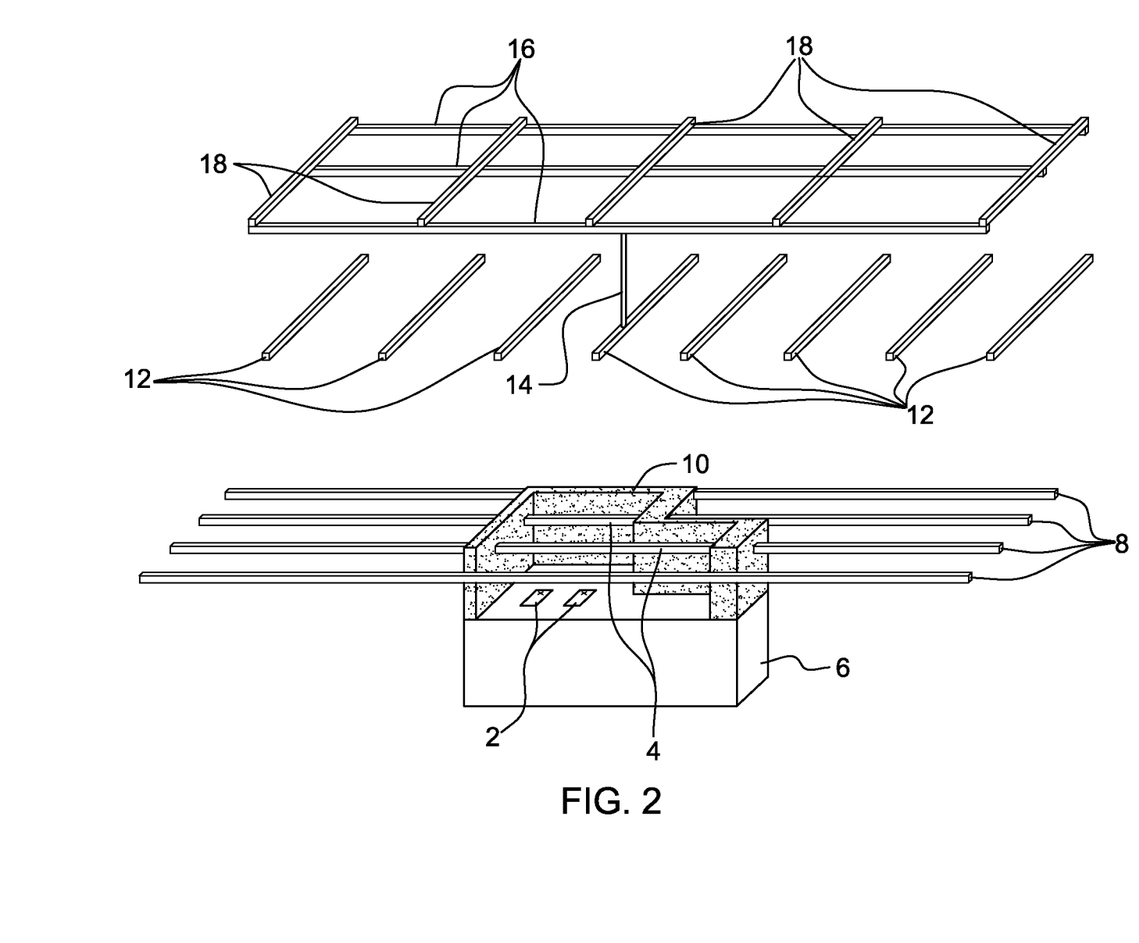
FIG. 2 is an illustration representing the parts, structures and layout of an initial design for a microprocessor which will be used as an example to demonstrate the functioning of an automated customization system in accordance with an embodiment of the present invention.

FIG. 2 is an illustration of an initial design for a microprocessor which requires routing of a signal (a clock signal) from a routing terminus, which in this example is a clock mesh (i.e. routing track 16 and 18 of the fifth metal layer and the sixth metal layer, respectively), to a component 2. A fourth routing track 12 is included within the fourth metal layer and are connected to the clock mesh by VIA 14. Alpha routing track 8 are included within the second metal layer. The beta routing track and the blockage, located on the fourth metal layer, are not shown. To facilitate the visualization of the parts and structures of this embodiment, the metal layers are not defined by part numbers or with the use of depictions in the illustrations. The boundaries of the metal layers, for this example, are herein defined as encompassing the components designated as residing within the respective metal layer. The exception to this is area 6, which represents a small part of metal layer 1 that contains the component 2.

Figure 3:
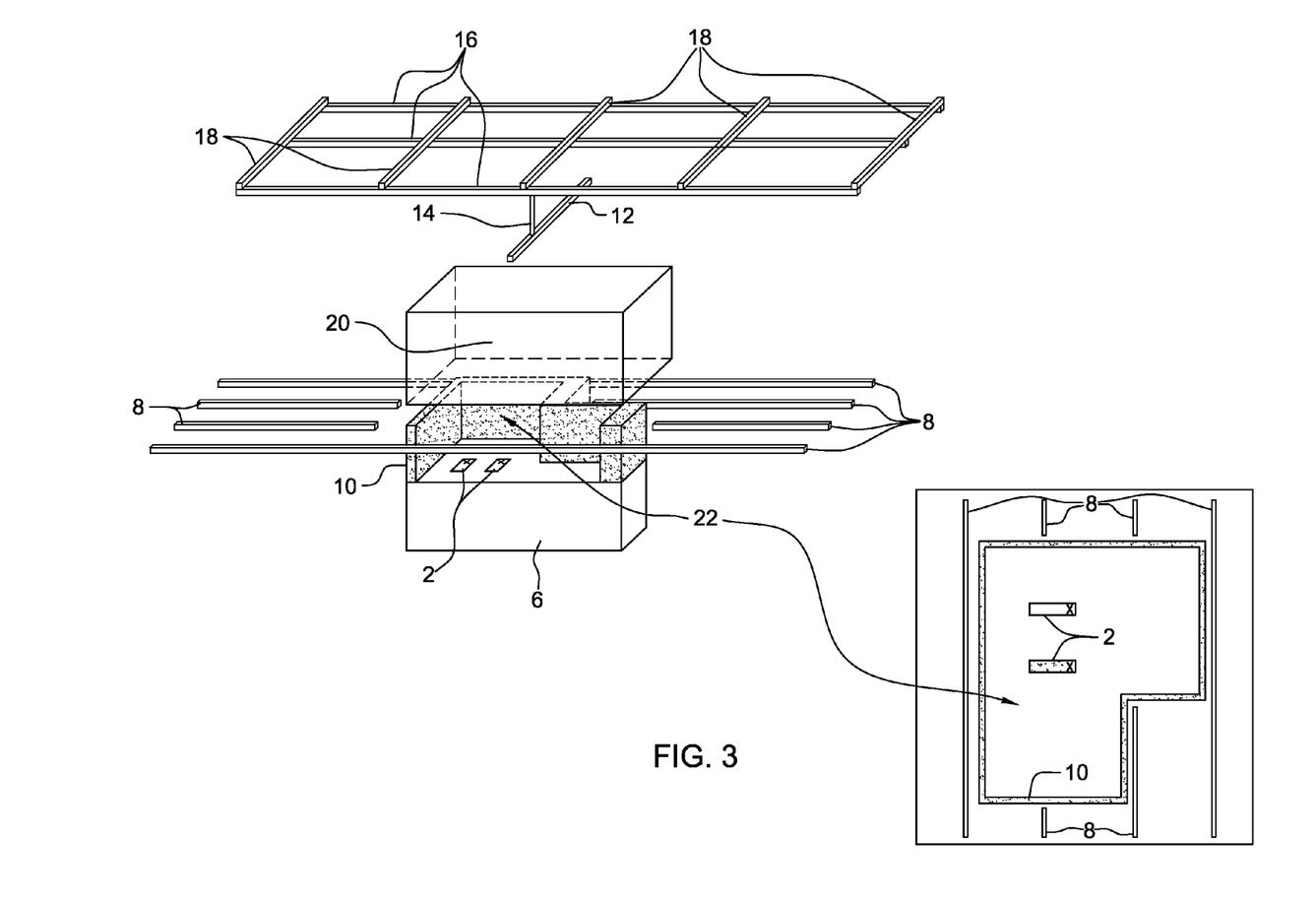
FIG. 3 is an illustration representing the parts, structures and layout of an example used to depict the step of removing a segment track from a first section of the microchip design in accordance with an embodiment of the present invention.

A blockage 10 is located on the second metal layer and the segregated routing track 4. A section of segregated routing track is herein after referred to as a segment routing track. The term blockage 10 herein refers to blockages located on alpha routing track, which create track segments, but is illustrated as a three dimensional shape which defines the edges of first section 22, which is illustrated in FIG. 3 only. It should be noted that, for ease of viewing, in FIGS. 2 and 3 the one outer edge of blockage 10 is excluded from view and not shown in the central figures. The excluded outer edge included in the top plan view of FIG. 3. For ease of viewing and simplification of the illustrations, blockage 10 is not shown in whole or in part in FIGS. 4-8.

Routing track 16 and routing track 18 represent the routing track of the fifth and sixth metal layers, respectively. Routing track 16 and routing track 18 are connected by vias (not shown) and thereby compose, and are herein referred to as, a clock mesh. Area 6 is represents a piece of the first metal layer, which in certain embodiments may be a plurality of metal layers. Component 2 is a component (a routing track and clock pin structure) found in the first metal layer and is represented by a rectangle on the surface of the first metal layer as seen in area 6. The two dimensional representation of part 2 is for illustrative purposes only. In this example, the component is a three dimensional structure, if seen, it resembles a long thin rectangular block of metal.

FIG. 3 is an illustration depicting the removal of the track segments from a first section 22. The location of first section 22 is within the second metal layer. The location of a second section 20 is within the third metal layer. The first and second sections are regions where routing track and VIA structures may be placed. The second section is only shown in FIG. 3, however, the second section exists in FIGS. 2-8. The boundaries and technique defining the first section and the second section may vary in other embodiments. In some embodiments the blockage of alpha routing track that creates first section 22 may be interpreted as a shape or macro within the design.

In this exemplary embodiment, the third metal layer and second section 20 within the third metal layer are composed of two separate metal layers, which can provide space for routing track and VIA structures. A top plan view of the first section with the segment track removed is shown. In the top plan view component 2 is depicted as having two rectangular boxes containing crossed lines. The crossed lines represent the relative position of the clock pin which is obscured from view by the routing track of component 2. Routing track 16 and routing track 18 are not depicted in the top plan views of FIGS. 3-7 but are present. The location of routing track 16 is depicted in the top plan view of FIG. 8.

Figure 4:
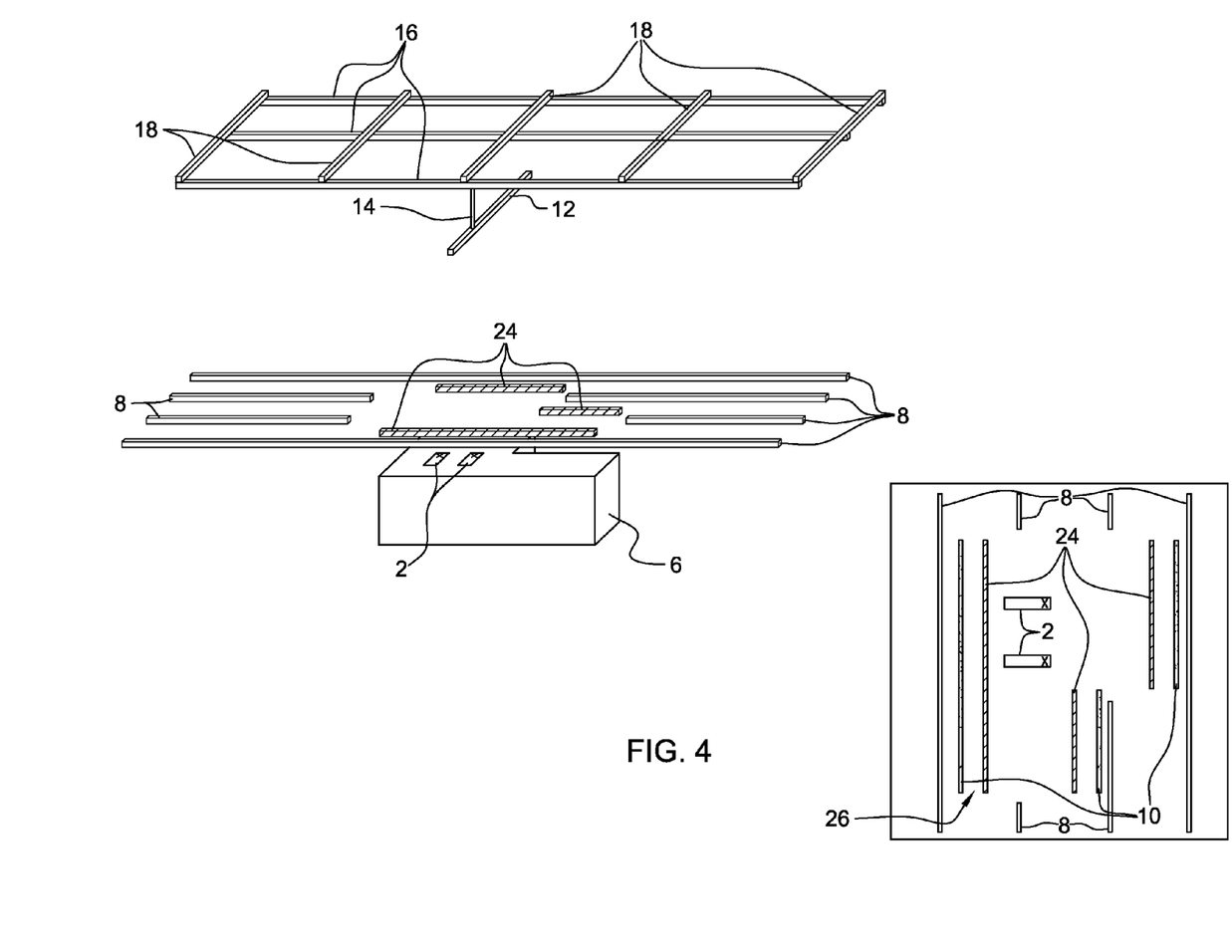
FIG. 4 is an illustration representing the parts, structures and layout of an example used to depict the step of adding a first routing track to the microchip design in accordance with an embodiment of the present invention.

FIG. 4 is an illustration depicting the addition of a first routing track 24 to first section 22 of the second metal layer. First routing track 24 is placed such that select components (not shown) located outside of first section 22 may be connected to the first routing track without violation of the design rules located in design criteria 130. First routing track 24 is added such that a portion of the first routing track is substantially parallel to a alpha routing track 8 and is placed inside of blockage 10. Substantially parallel is to be understood by a person with ordinary skill in the art as encompassing small variations in orientation such that the parallel nature of one object relative to another is understood. Blockage 10 located on the second metal layer is not be shown in FIGS. 4-8 but is still present. In FIG. 4 only, the top plan view depicts pieces of blockage 10, to further illustrate the location and substantially parallel orientation of first routing track 24. Space 26 is defined as a space between blockage 10 and first routing track 24. In this example, the distance of space 26 is related to the limitations and rules regarding track location for the second metal layer and are influenced by the design limitations and rules for track length and track location within the first metal layer.

Figure 5:
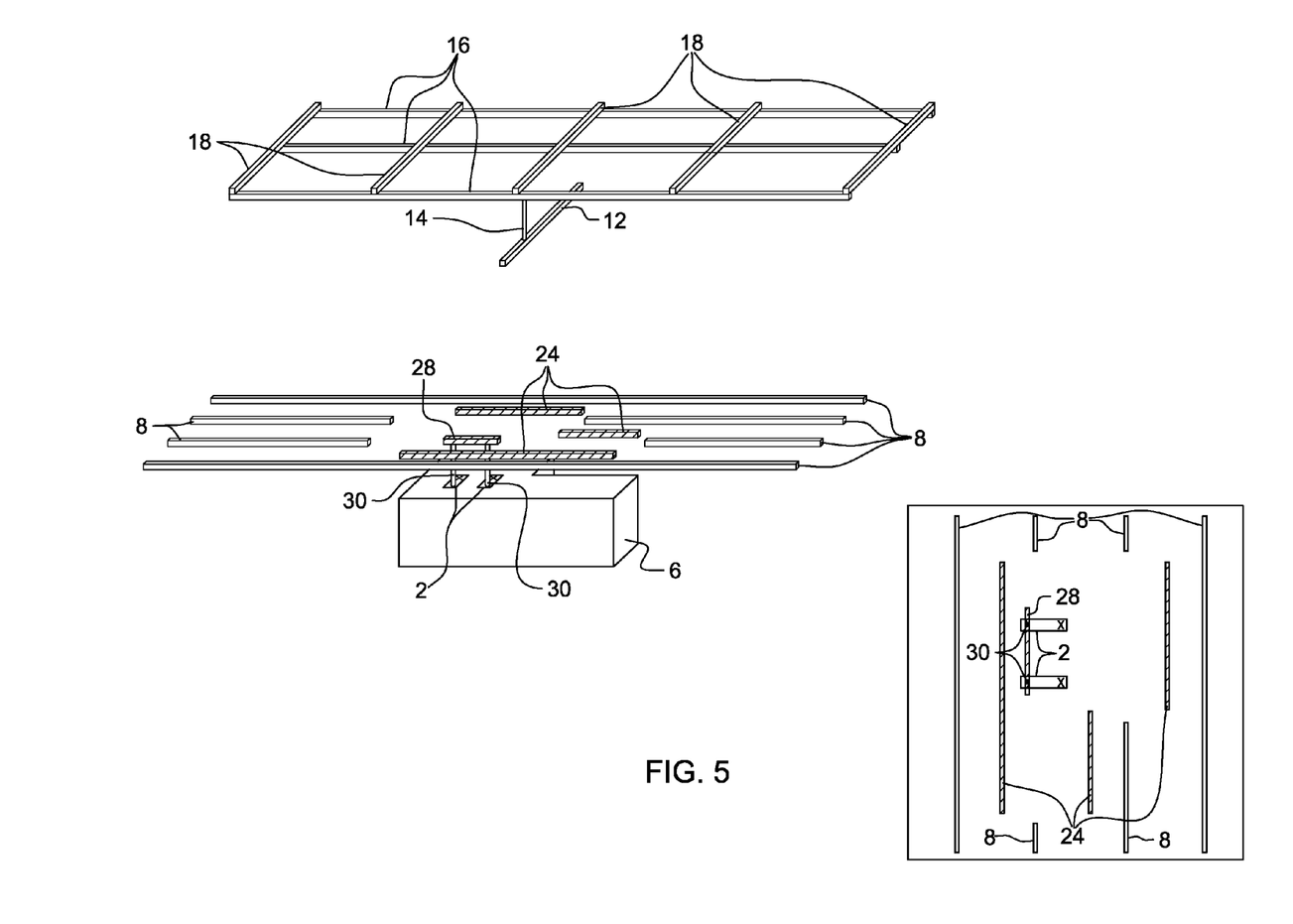
FIG. 5 is an illustration representing the parts, structures and layout of an example used to depict the step of adding a second routing track and vertical interconnect access (VIA) structures to the microchip design in accordance with an embodiment of the present invention.

FIG. 5 is an illustration depicting the addition of a second routing track 28 to the second metal layer and two VIA structure 30 to connect the second routing track to component 2. In this example, first routing track 24 is located at a distance from component 2 that prevents the formation of a connection using a VIA structure, since such a connection would violate the design limits and rules. Therefore, the addition of second routing track 28 to the second metal layer and VIA structure 30 becomes necessary. The top plan view further illustrates the location of the connecting VIA structure 30 and second routing track 28. In this example, VIA structure 30 is shown to connect to an end of first metal layer track which is located opposite to the end where the clock pin exists, which is in accordance with the design rules and limitations. The technique of connecting to the clock pin and location of the second routing track may vary in other embodiments. In other embodiments, there may be multiple areas, components and sections similar to area 6, component 2 and first section 22, wherein first routing track 24, second routing track 28 and VIA structure 30 can be added following the same steps illustrated in FIGS. 4 and 5.

Figure 6:
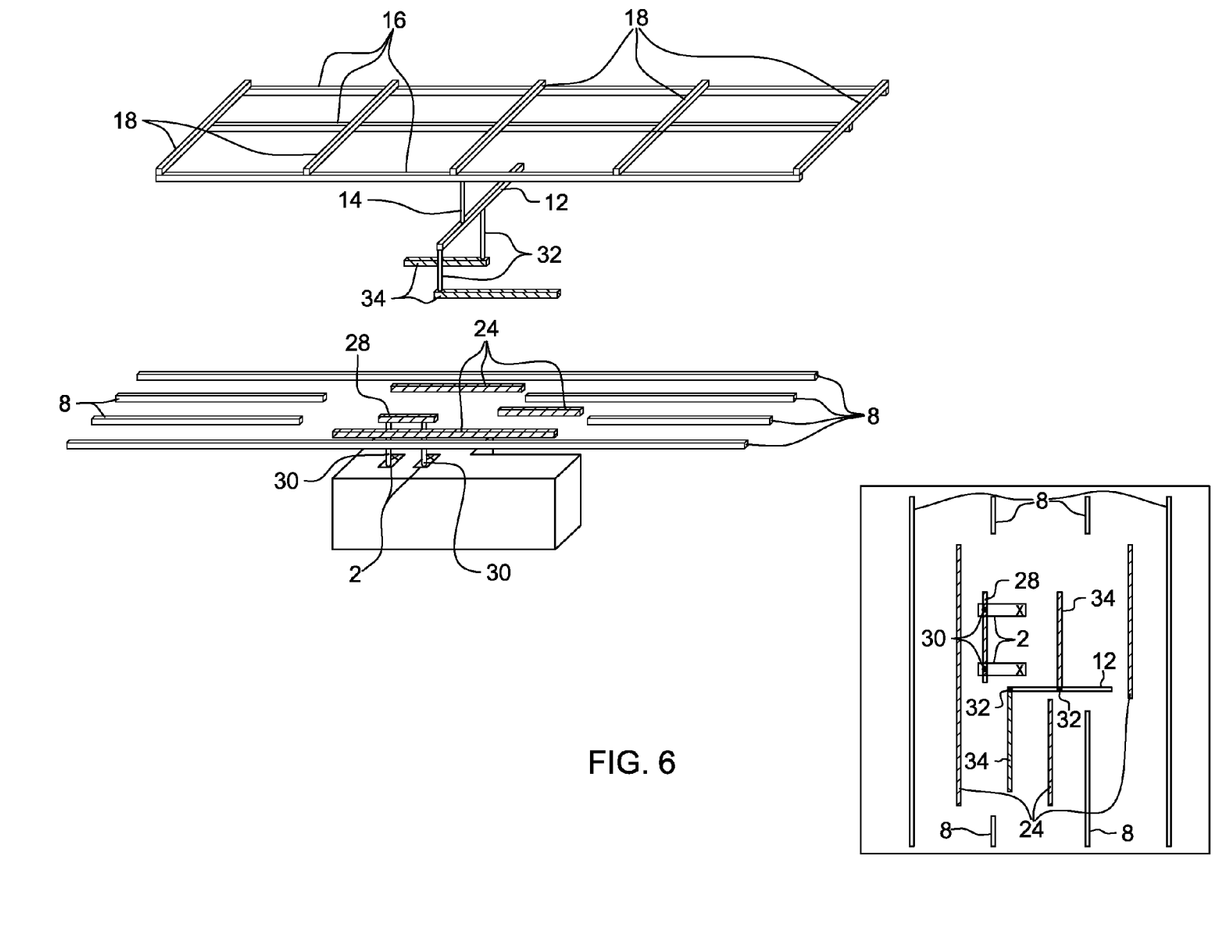
FIG. 6 is an illustration representing the parts, structures and layout of an example used to depict the step of adding a third routing track and VIA structures to the microchip design in accordance with an embodiment of the present invention.

FIG. 6 is an illustration of the addition of a third routing track 34 to second section 20. In this example, there are two metal layers which constitute the third metal layer. For the purpose of reference the two metal layers, which constitute the third metal layer, will be referred to herein as a top metal layer and a bottom metal layer. The top metal layer being defined herein as the metal layer, which is closest to the fourth metal layer and the bottom metal layer being defined herein as the metal layer closest to the second metal layer. A VIA structure 32, of the top metal layer, connects third routing track 34 to fourth routing track 12. The third metal layer contains gamma routing tracks that are not shown but still exist. Gamma routing tracks are used for a variety of routings, for example, power and ground track. Gamma routing tracks are blocked off from contact with any third routing track 34 added to the third metal layer. In other embodiments it may be common for the third metal layer to be not one but a number of metal layers and the technique of both routing track and VIA structure placement may vary.

The top plan view further illustrates the location of third routing track 34 and VIA structure 32 of the top metal layer. It should be observed that the two third routing tracks 34 are in a substantially parallel orientation with first routing track 24 and second routing track 28. To connect third routing track 34, of the top metal layer, to all three first routing tracks 24 and to second routing track 28, at least four third routing tracks are required in very specific locations, which is not possible in this example since it would violate the rules and limitations governing the design. Even if it were possible to place third routing track 34 to form connections with all three first routing tracks 24 and the second routing track 28, utilizing four third routing tracks is likely to produce a design with inherently high clock skew due to large differences in track length. Therefore, in this example, a substantially parallel orientation is not conducive to forming connections, from third routing track 34 to first routing track 24 and second routing track 28, while obeying the track length and track location limitations of this design example.

Figure 7:
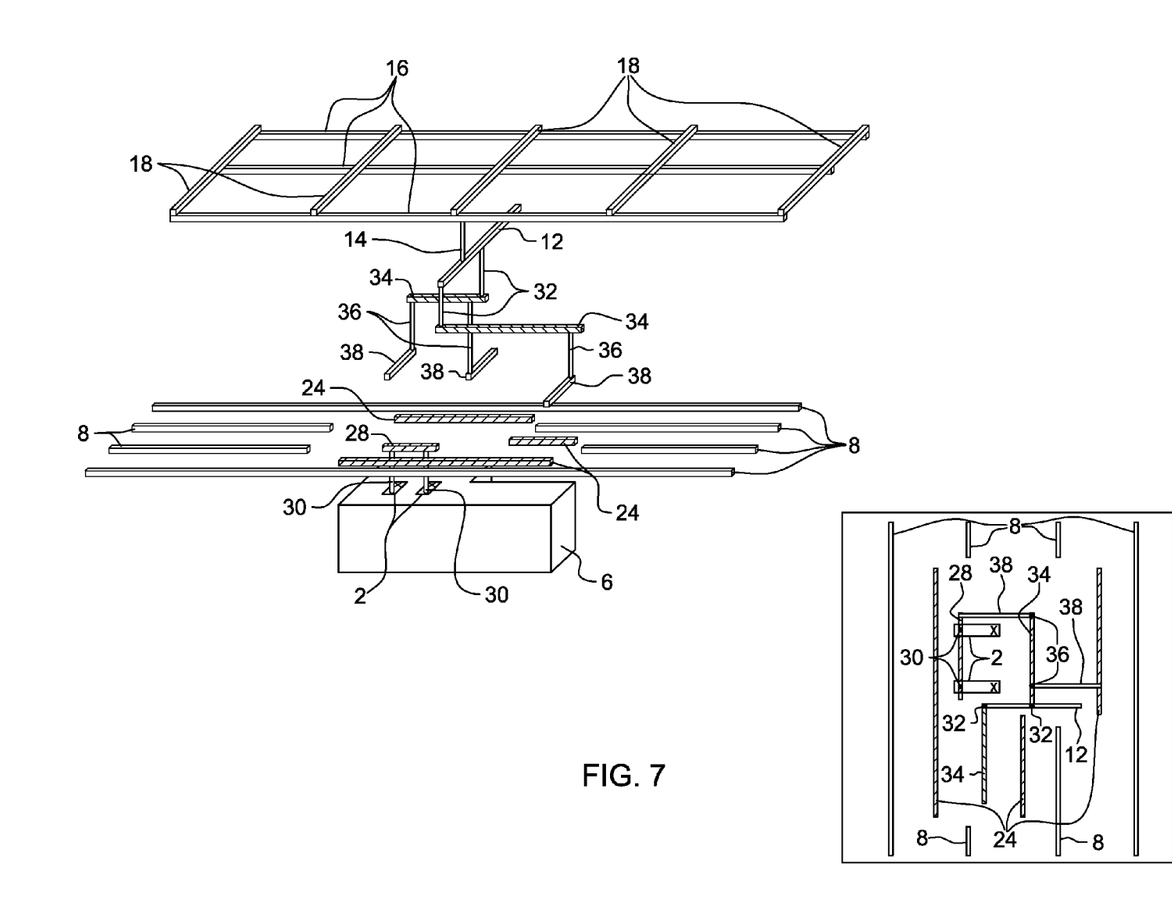
FIG. 7 is an illustration representing the parts, structures and layout of an example used to depict the step of adding a third routing track and VIA structures to the microchip design in accordance with an embodiment of the present invention.

FIG. 7 is an illustration of the addition of a third routing track 38 and a VIA structure 36 to the bottom metal layer of the third metal layer. Third routing tracks 38 of the bottom metal layer are connected, using VIA structure 36, to third routing track 34 of the top metal layer. It should be noted that third routing track 38 of the bottom metal layer is substantially perpendicular to first routing track 24 and second routing track 28. In this example, the substantially perpendicular orientation is conducive to the formation of connections which obey the track length and track location limitations of the design. The advantage of a perpendicular orientation of third routing track 38 to first routing track 24 and second routing track 28 is further illustrated in the top plan view. The top plan view illustrates how three first routing tracks 24 and second routing track 28 may be connected to the clock mesh with the addition of three third routing tracks 38 located on the bottom metal layer. It should be noted that the track positioning and total track lengths illustrated in this example are intended to minimize clock skew, where possible, while obeying the track length and track location limitations of the design.

Figure 8:
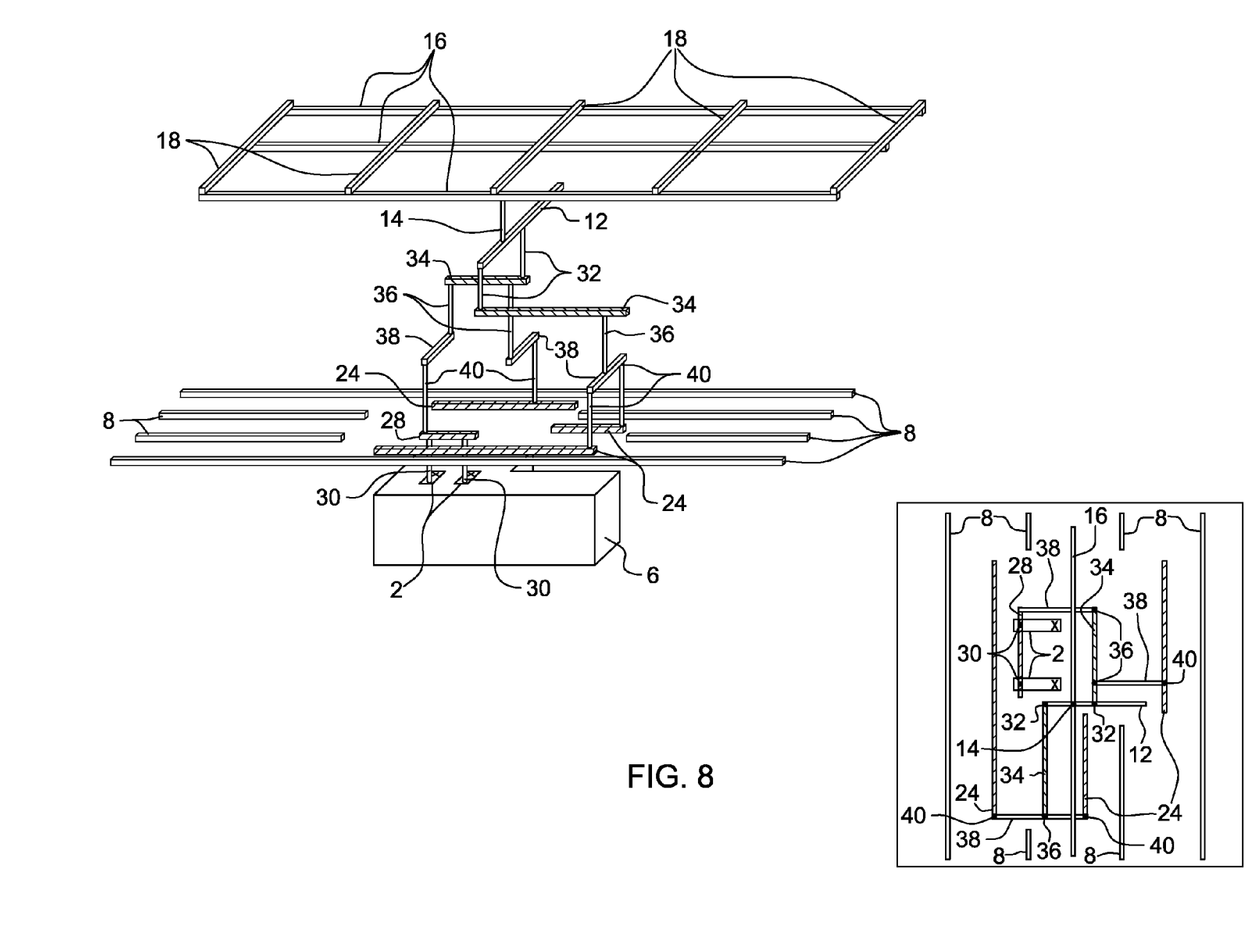
FIG. 8 is an illustration representing the parts, structures and layout of an example used to depict the step of adding VIA structures to the microchip design to connect a clock mesh to a component and a first routing track, in accordance with an embodiment of the present invention.

FIG. 8 is an illustration of the addition of a VIA structure 40 which forms a connection from three third routing tracks 38 of the bottom metal layer to three first routing tracks 24 and second routing track 28. Thus, a connection from the clock mesh to first routing track 24 and second routing track 28 is created while obeying the rules and limitations of design criteria 130. The top plan view depicts the overall structure of the routing from the clock mesh to first routing track 24 and second routing track 28. This example illustrates how a system for automatic routing customization may be applied. An embodiment and an example of an application of the present invention has been presented for purposes of illustration and description. The embodiment and example illustrated in FIGS. 2-8 is not to be exhaustive nor to limit the invention to the precise examples disclosed.

Figure 9:
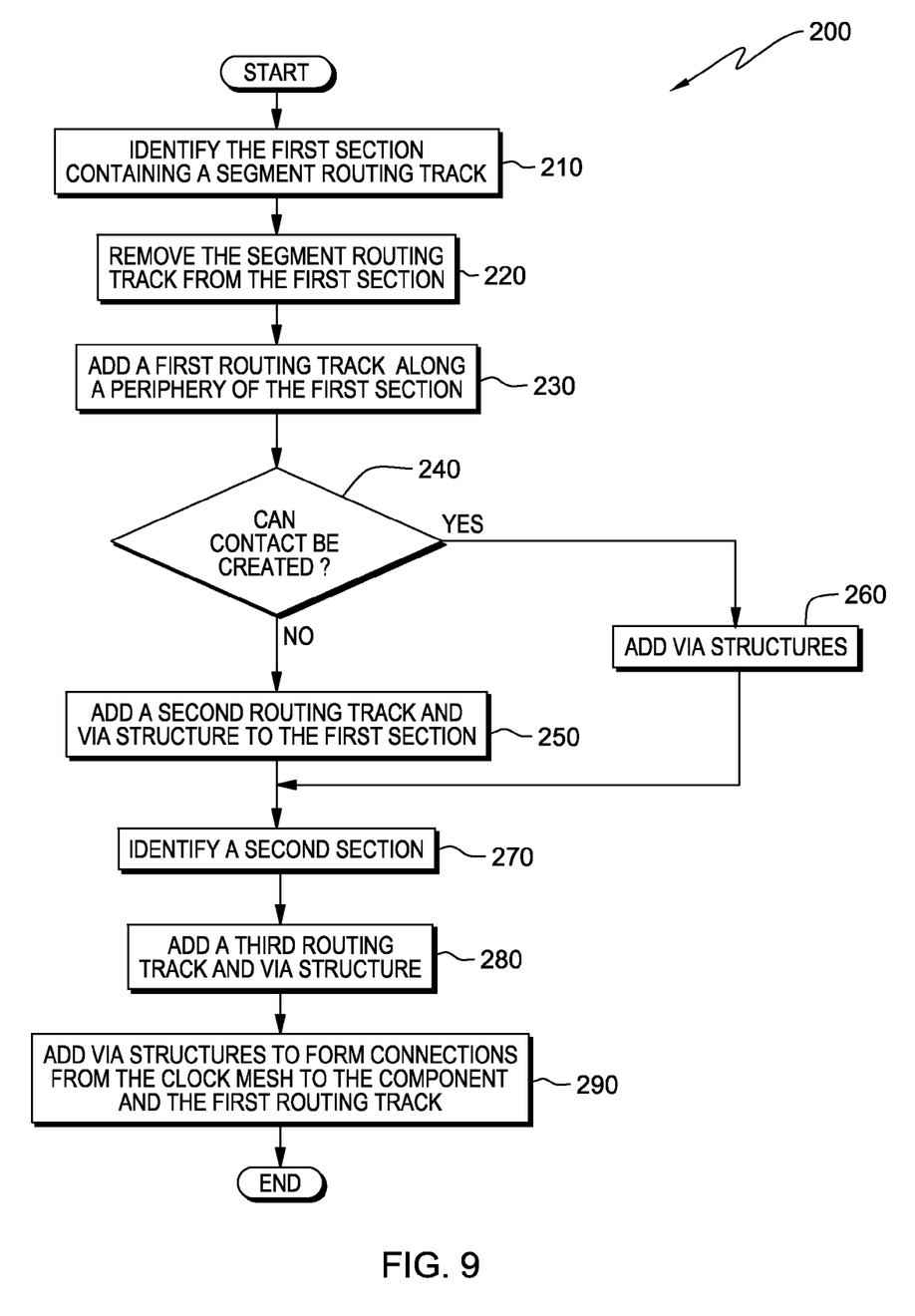
FIG. 9 is a flowchart illustrating the steps included in automated interconnect and routing customization performed by the customization software of FIG. 1 in accordance with an embodiment of the present invention.

FIG. 9 is a flowchart 200 illustrating the steps of customization software 120, running on computer 110, for the generation of a customized routing design in an exemplary embodiment. The steps are described in details herein below.

In this exemplary embodiment, in step 210, customization software 120 identifies a first section in routing design 140, which has an identification marker associated with it, located in the second metal layer that contains segment routing tracks. The segment routing tracks are segregated from the other routing tracks in the second metal layer by a blockage. The identification of a first section, segment routing track, and metal layers may vary in other embodiments.

Customization software 120 removes the segment routing tracks from the first section in the second metal layer, in step 220. By removing the segment routing tracks the possibility of a short circuit, within a microprocessor produced using the design, may be substantially reduced. Due to the track length limits and location restrictions for routing tracks, which in this embodiment are inherent properties of the microprocessor design, alternative routing tracks are desirable as an alternative to the removed segment routing track.

In this exemplary embodiment, in step 230, customization software 120 identifies a periphery of the first section, a portion of which is perpendicular to the alpha routing track, and adds first routing tracks along a portion of the perpendicular periphery of the first section. The first routing tracks are spaced apart from the periphery of the first section according to a distance related to the track length and location limits of the first metal layer. The location, length, addition of first routing track and spacing between the first routing track and the periphery of the first section may vary in other embodiments.

Customization software 120 determines if contact can be created between the component of the first metal layer and at least one of the first routing tracks 24, in step 240. Contact is determined to be possible if a VIA structure can be added, without violation of design rules and limitations, between first routing track 24 and component 2 thus creating a connection capable of carrying a signal from the first routing track to the component.

In this exemplary embodiment, responsive to determining component 2 cannot be contacted by first routing track 24, with the addition of a VIA structure, customization software 120 adds a second routing track 28 to the first section in step 250. Second routing track 28 is placed substantially parallel with first routing track 24 and in a location such that a VIA structure can be added to connect the second routing track and component 2. A VIA structure is then added to the microprocessor design resulting in a connection, between second routing track 28 and component 2, which is capable of carrying a signal from first routing track 24 to the component. The technique of forming a connection from component 2 to second routing track 28 may vary in other embodiments.

If, in step 240, customization software 120 determines that contact can be created between first routing track 24 and component 2, then in step 260 customization software 120 adds a VIA structure to the microprocessor design forming a connection between the component and the first routing track. Appropriate connecting structures (VIAs and routing tracks) are also added to connect components located outside of the blockage to first routing track 24 while adhering to the design rules and limitations. The connections formed are capable of carrying a signal from first routing track 24 to respective component 2. The technique of forming a connection from component 2 to first routing track 24 may vary in other embodiments.

In this exemplary embodiment, customization software 120 identifies a second section in a third metal layer, in step 270, where routing tracks and VIA structures may be added to form connections from first routing track 24 and second routing track 28 to the fourth metal layer routing track. There are inherent rules governing the placement of tracks and VIA structures within a given microprocessor design. These design rules limit the options available for track and VIA placement. The rules governing the placement of track and VIAs may vary in other embodiments. In other embodiments the technique of identifying the second section may vary.

Customization software 120 adds at least one third routing track and VIA structure to the third metal layer, in step 280. A third routing track 34 is placed such that a connection may be created between the fourth metal layer routing track and first routing track 24 and second routing track 28 with the addition of the respective VIA structures to form the connections between the metal layers.

In this exemplary embodiment, customization software 120 adds VIA structures to form connections from third routing track 34 to first routing track 24 and second routing track 28 (step 290). Thus, contact is achieved between the clock mesh to component 2 and first routing track 24. In other embodiments, there may be a number of first sections and components that are connected to the clock mesh using the steps illustrated in FIG. 9 and may require a modification to the placement of routing track and VIAs in the second section of the third metal layer to form the desired connections to the clock mesh while obeying all design limitations.

Figure 10:
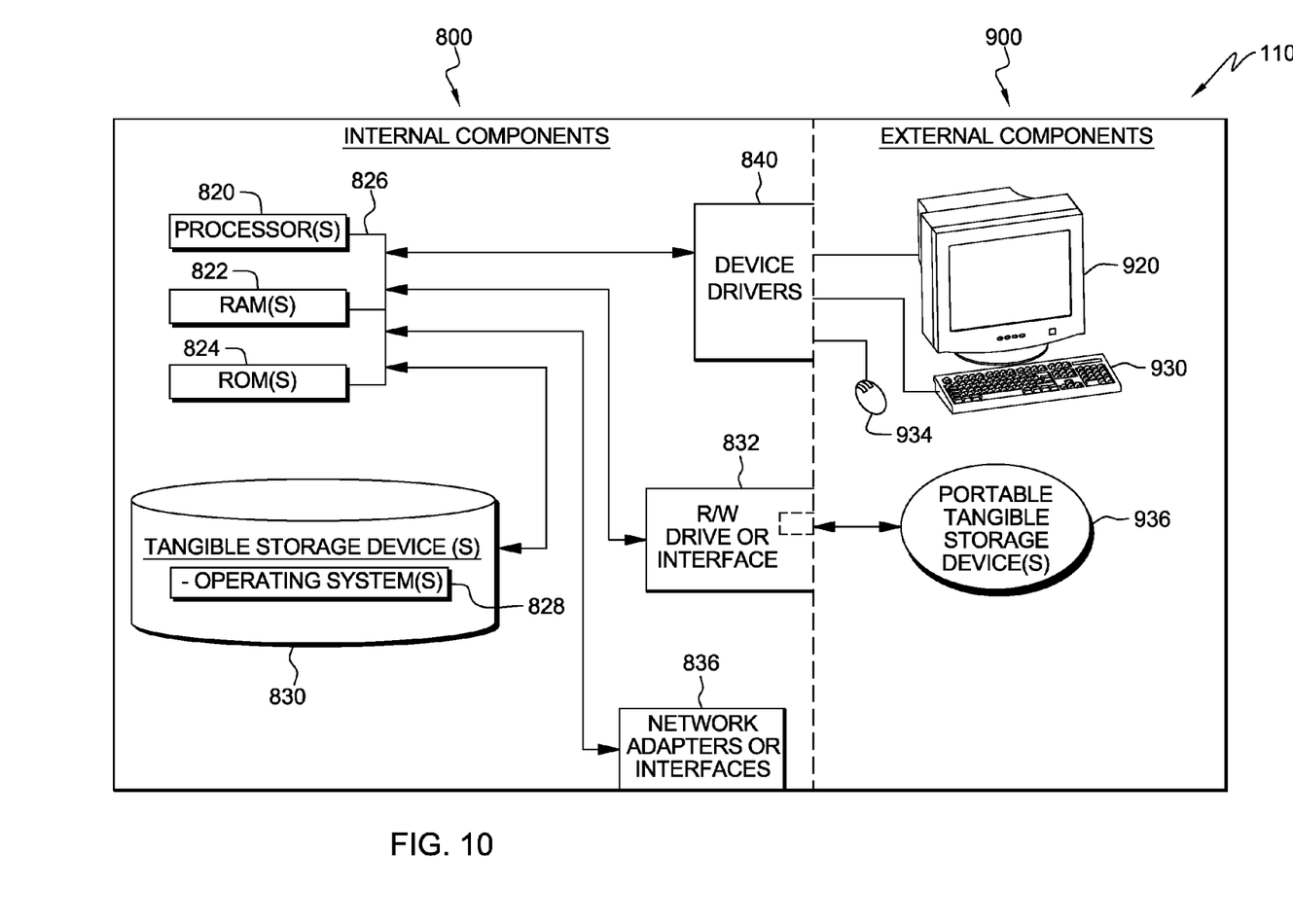
FIG. 10 is a block diagram of internal and external components within the computing devices of FIG. 1 in accordance with an embodiment of the present invention.

FIG. 10 shows a block diagram of the components of computer 110, in accordance with an illustrative embodiment of the present invention. It should be appreciated that FIG. 10 provides only an illustration of one implementation and does not imply any criteria with regard to the environments in which different embodiments may be implemented. Many modifications to the depicted environments may be made based on design and implementation requirements.

Computer 110 is representative of any electronic device capable of executing machine-readable program instructions. Computer 110 may be representative of a smart phone, a computer system, PDA, or other electronic devices. Examples of computing systems, environments, and/or configurations that may represented by computer 110 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

Computer 110 includes a set of internal components 800 and external components 900 illustrated in FIG. 10. The set of internal components 800 includes one or more processors 820, one or more computer-readable RAMs 822 and one or more computer-readable ROMs 824 on one or more buses 826, and one or more operating systems 828 and one or more computer-readable tangible storage devices 830. The one or more operating systems 828, customization software 120, files design criteria 130 and routing design 140 are stored on one or more of the respective computer-readable tangible storage devices 830 for execution by one or more of the respective processors 820 via one or more of the respective RAMs 822 (which typically include cache memory). In the embodiment illustrated in FIG. 10, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory or any other computer-readable tangible storage device 830 that can store a computer program and digital information.

Each set of internal components 800 also includes a R/W drive or interface 832 to read from and write to one or more portable computer-readable tangible storage devices 936 such as a CD-ROM, DVD, memory stick, magnetic tape, magnetic disk, optical disk or semiconductor storage device. Customization software 120, files design criteria 130 and routing design 140 in remote computer 110 can be stored on one or more of the respective portable computer-readable tangible storage devices 936, read via the respective R/W drive or interface 832 and loaded into the respective computer-readable tangible storage device 830.

Each set of internal components 800 also includes network adapters or interfaces 836 such as a TCP/IP adapter cards, trackless wi-fi interface cards, or 3G or 4G trackless interface cards or other wired or wireless communication links. The customization software 120, files design criteria 130, and routing design 140 in computer 110 can be downloaded from an external computer via a network (for example, the Internet, a local area network or other, wide area network) and respective network adapters or interfaces 836. From the network adapters or interfaces 836, the customization software 120 and files design criteria 130 and routing design 140 in computer 110 are loaded into the respective computer read-able tangible storage device 830. The network may comprise copper track, optical fibers, trackless transmission, routers, firewalls, switches, gateway computers and/or edge servers.

Each of the sets of external components 900 can include a computer display monitor 920, a keyboard 930, and a computer mouse 934. External components 900 can also include touch screens, virtual keyboards, touch pads, pointing devices, and other human interface devices. Each of the sets of internal components 800 also includes device drivers 840 to interface to computer display monitor 920, keyboard 930 and computer mouse 934. The device drivers 840, R/W drive or interface 832 and network adapter or interface 836 comprise hardware and software (stored in computer read-able storage device 830 and/or ROM 824).

Aspects of the present invention have been described with respect to block diagrams and/or flowchart illustrations of methods, apparatus (system), and computer program products according to embodiments of the invention. It will be understood that each block of the flowchart illustrations and/or block diagrams, and combinations of blocks in the flowchart illustrations and/or block diagrams, can be implemented by computer instructions. These computer instructions may be provided to a processor of a general purpose computer, special purpose computer, or other programmable data processing apparatus to produce a machine, such that instructions, which execute via the processor of the computer or other programmable data processing apparatus, create means for implementing the functions/acts specified in the flowchart and/or block diagram block or blocks.

The aforementioned programs can be written in any combination of one or more programming languages, including low-level, high-level, object-oriented or non object-oriented languages, such as Java, Smalltalk, C, and C++. The program code may execute entirely on the user's computer, partly on the user's computer, as a stand-alone software package, partly on the user's computer and partly on a remote computer, or entirely on a remote computer or server. In the latter scenario, the remote computer may be connected to the user's computer through any type of network, including a local area network (LAN) or a wide area network (WAN), or the connection may be made to an external computer (for example, through the Internet using an Internet service provider). Alternatively, the functions of the aforementioned programs can be implemented in whole or in part by computer circuits and other hardware (not shown). One of the preferred implementations of the invention is an application, namely, a set of instructions (program code) in a code module which may, for example, be resident in the random access memory of the computer. Until required by the computer, the set of instructions may be stored in another computer memory, for example, on a hard disk drive, or in removable storage such as an optical disk (for eventual use in a CD ROM) or floppy disk (for eventual use in a floppy disk drive), or downloaded via the Internet or other computer network. Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

While particular embodiments of the present invention have been shown and described, it will be obvious to those skilled in the art that based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For a non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

Based on the foregoing, computer system, method and program product have been disclosed in accordance with the present invention. However, numerous modifications and substitutions can be made without deviating from the scope of the present invention. Therefore, the present invention has been disclosed by way of example and not limitation.

What is claimed is:

1. A method for automated interconnect and routing customization, the method comprising the steps of:
    a computer identifying a segment routing track located in a first section of a second metal layer that includes an alpha routing track, wherein the segment routing track is segregated from the alpha routing track by a first blockage, and wherein the second metal layer is adjacent to a first metal layer that includes a first component that terminates within the first metal layer;
    the computer removing the segment routing track from the first section of the second metal layer;
    the computer adding a first routing track to the second metal layer along at least a portion of a periphery of the first section, such that the first routing track is not in contact with the alpha routing track and such that at least a portion of the first routing track is substantially parallel to at least a portion of the alpha routing track;
    the computer identifying the first component outside a region of contact of the first routing track;
    the computer adding a second routing track to the second metal layer such that the first component is within the region of contact of the second routing track; and
    the computer adding a connection between the second metal layer and a routing terminus.

2. The method of claim 1, wherein the step of adding a connection between the second metal layer and a routing terminus includes:
    the computer adding at least a first VIA structure to connect one or both of the first routing track or the second routing track to the routing terminus.

3. The method of claim 2, wherein the step of adding at least a first VIA structure to connect one or both of the first routing track or the second routing track to the routing terminus further includes:
    identifying a second section in a third metal layer, located above the first section of the second metal layer such that a face of the first section is adjacent to and overlaps at least a portion of a face of the second section;
    adding to the second section one or more third routing tracks, wherein the one or more third routing tracks are placed such that the one or more third routing tracks are segregated from contact with gamma routing tracks included within the third metal layer;
    adding a second VIA structure to connect the one or more third routing tracks to one or both of the first routing track or the second routing track;
    adding a third VIA structure to connect the second routing track to the first component; and
    adding a fourth VIA structure to connect the third routing track to the routing terminus.

4. The method of claim 2, wherein the step of adding at least a first VIA structure to connect one or both of the first routing track or the second routing track to the routing terminus further includes:
    identifying a fourth metal layer that includes one or more fourth routing tracks in contact with the routing terminus, wherein the fourth metal layer includes beta routing tracks that are segregated from contact with the one or more fourth routing tracks;

adding a fifth VIA structure to connect the one or more fourth routing tracks to one or both of the first routing track or the second routing track;

adding a sixth VIA structure to connect the second routing track to the first component; and adding a seventh VIA structure to connect the fourth routing track to the routing terminus.

5. The method of claim 1, further comprising the steps of:

the computer identifying a second component that terminates within the first metal layer;

the computer determining the second component is inside the region of contact of the first routing track; and the computer adding a VIA structure to connect the second component to the first routing track.

6. The method of claim 1, wherein the first section is further defined by a shape having a periphery defined, at least in part, by the blockage of the alpha routing track of the second metal layer.

7. The method of claim 1, wherein the routing terminus includes at least one of, a clock signal source, a power source, an electromagnetic signal source, a ground terminal, or a third component.

8. A computer system for automated interconnect and routing customization, the computer system comprising:

one or more processors, one or more computer-readable memories, one or more computer-readable tangible storage devices, and program instructions stored on at least one of the one or more storage devices for execution by at least one of the one or more processors via at least one of the one or more memories, the program instructions comprising:

program instructions to identify a segment routing track located in a first section of a second metal layer that includes an alpha routing track, wherein the segment routing track is segregated from the alpha routing track by a first blockage, and wherein the second metal layer is adjacent to a first metal layer that includes a first component that terminates within the first metal layer;

program instructions to remove the segment routing track from the first section of the second metal layer;

program instructions to add a first routing track to the second metal layer along at least a portion of a periphery of the first section, such that the first routing track is not in contact with the alpha routing track and such that at least a portion of the first routing track is substantially parallel to at least a portion of the alpha routing track;

program instructions to identify a first component located outside a region of contact of the first routing track;

program instructions to add a second routing track to the second metal layer such that the first component is within the region of contact of the second routing track; and program instructions to add a connection between the second metal layer and a routing terminus.

9. The computer system of claim 8, wherein program instructions to add a connection between the second metal layer and a routing terminus includes:

program instructions to add at least a first VIA structure to connect one or both of the first routing track or the second routing track to the routing terminus.

10. A computer system of claim 9, wherein the program instructions to add at least a first VIA structure to connect one or both of the first routing track or the second routing track to the routing terminus further includes:

program instructions to identify a second section in a third metal layer, located above the first section of the second metal layer such that a face of the first section is adjacent to and overlaps at least a portion of a face of the second section;

program instructions to add to the second section one or more third routing tracks, wherein the one or more third routing tracks are placed such that the one or more third routing tracks are segregated from contact with gamma routing tracks included within the third metal layer;

program instructions to add a second VIA structure to connect the one or more third routing tracks to one or both of the first routing track or the second routing track;

program instructions to add a third VIA structure to connect the second routing track to the first component; and program instructions to add a fourth VIA structure to connect the third routing track to the routing terminus.

11. A computer system of claim 9, wherein the program instructions to add at least a first VIA structure to connect one or both of the first routing track or the second routing track to the routing terminus further includes:

program instructions to identify a fourth metal layer that includes one or more fourth routing tracks that are in contact with the routing terminus, wherein the fourth metal layer includes beta routing tracks that are segregated from contact with the one or more fourth routing tracks;

program instructions to add a fifth VIA structure to connect the one or more fourth routing tracks to one or both of the first routing track or the second routing track;

program instructions to add a sixth VIA structure to connect the second routing track to the first component; and program instructions to add a seventh VIA structure to connect the fourth routing track to the routing terminus.

12. The computer system of claim 8, further comprising program instructions to:

identify a second component that terminates within the first metal layer;

determine the second component is inside the region of contact of the first routing track; and add a VIA structure to connect the second component to the first routing track.

13. The computer system of claim 8, wherein the routing terminus includes at least one of, a clock signal source, a power source, an electromagnetic signal source, a ground terminal, or a third component.

14. A computer program product for automated interconnect and routing customization, the computer program product comprising:

one or more computer-readable storage devices and program instructions stored on at least one of the one or more tangible storage devices, the program instructions comprising:

program instructions to identify a segment routing track located in a first section of a second metal layer that includes an alpha routing track, wherein the segment routing track is segregated from the alpha routing track by a first blockage, and wherein the second metal layer is adjacent to a first metal layer that includes a first component that terminates within the first metal layer;

program instructions to remove the segment routing track from the first section of the second metal layer;

program instructions to add a first routing track to the second metal layer along at least a portion of a periphery of the first section, such that the first routing track is not in contact with the alpha routing track and such that at least a portion of the first routing track is substantially parallel to at least a portion of the alpha routing track;

program instructions to identify a first component located outside a region of contact of the first routing track;

program instructions to add a second routing track to the second metal layer such that the first component is within the region of contact of the second routing track; and program instructions to add a connection between the second metal layer and a routing terminus.

15. The computer program product of claim 14, wherein program instructions to add a connection between the second metal layer and a routing terminus includes:

program instructions to add at least a first VIA structures to connect one or both of the first routing track or the second routing track to the routing terminus.

16. The computer program product of claim 15, wherein the program instructions to add at least a first VIA structure to connect one or both of the first routing track or the second routing track to the routing terminus includes:

program instructions to identify a second section in a third metal layer, located above the first section of the second metal layer such that a face of the first section is adjacent to and overlaps at least a portion of a face of the second section;

program instructions to add to the second section one or more third routing tracks, wherein the one or more third routing tracks are placed such that the one or more third routing tracks are segregated from contact with gamma routing tracks included within the third metal layer;

program instructions to add a second VIA structure to connect the one or more third routing tracks to one or both of the first routing track or the second routing track;

program instructions to add a third VIA structure to connect the second routing track to the first component; and program instructions to add a fourth VIA structure to connect the third routing track to the routing terminus.

17. The computer program product of claim 15, wherein the program instructions to add one or more VIA structures to connect one or both of the first routing track or the second routing track to the routing terminus includes:

program instructions to identify a fourth metal layer that includes one or more fourth routing tracks that are in contact with the routing terminus, wherein the fourth metal layer includes beta routing tracks that are segregated from contact with the one or more fourth routing tracks;

program instructions to add a fifth VIA structure to connect the one or more fourth routing tracks to one or both of the first routing track or the second routing track;

program instructions to add a sixth VIA structure to connect the second routing track to the first component; and program instructions to add a seventh VIA structure to connect the fourth routing track to the routing terminus.

18. The computer program product of claim 14, further comprising program instructions to:

identify a second component that terminates within the first metal layer;

determine the second component is inside the region of contact of the first routing track; and add a VIA structure to connect the second component to the first routing track.

19. The computer program product of claim 14, wherein the first section is further defined by a shape having a periphery defined, at least in part, by the blockage of the alpha routing track of the second metal layer.

20. The computer program product of claim 14, wherein the routing terminus includes at least one of, a clock signal source, a power source, an electromagnetic signal source, a ground terminal, or a third component.

* * * * *